(12) United States Patent
Bonaccio et al.

(10) Patent No.: US 6,337,573 B1
(45) Date of Patent: Jan. 8, 2002

(54) CONTACT TEST CIRCUIT

(75) Inventors: Anthony R. Bonaccio, Shelburne; Howard J. Leighton, Underhill, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/360,150

(22) Filed: Jul. 26, 1999

Related U.S. Application Data

(62) Division of application No. 08/942,217, filed on Oct. 1, 1997, now Pat. No. 6,087,841.

(51) Int. Cl.⁷ ............................................. G01R 1/073
(52) U.S. Cl. .................... 324/757; 324/158.1; 324/538; 324/754
(58) Field of Search ................................. 324/754, 763, 324/765, 769, 158.1, 537, 538, 757

(56) References Cited

U.S. PATENT DOCUMENTS

| 3,867,693 A | | 2/1975 | Saxenmeyer, Sr. | 324/756 |
| 4,342,958 A | * | 8/1982 | Russell | 324/754 |
| 4,484,136 A | | 11/1984 | Tuttle | 324/537 |
| 4,517,512 A | * | 5/1985 | Petrich | 324/754 |
| 4,646,002 A | * | 2/1987 | Tuszyski | 324/754 |
| 5,610,530 A | * | 3/1997 | Whetsel | 324/763 |

* cited by examiner

Primary Examiner—Vinh P. Nguyen
Assistant Examiner—Trung Q. Nguyen
(74) Attorney, Agent, or Firm—McGuireWoods, LLP; Mark F. Chadurjian

(57) ABSTRACT

A method and apparatus for contact testing a plurality of devices under test, either sequentially or simultaneously. In a first test phase it is determined whether the test probe to each contact is shorted to the most negative rail. In a second phase it is determined whether the test probe has made proper contact, and whether ESD diodes on the devices under test are functional. In both test phases a negative pulse is generated on a tester bus and applied to the contact by the test probe. In the first test phase the positive rail of the device under test is grounded; in the second test phase the positive rail of the device under test is made positive. The negative rail of the device under test is connected to the negative rail of the tester. In both test phases, upon termination of the negative pulse, the bus is restored to a positive voltage which is dependent upon the condition of the contact and the condition of expected input devices at the contact. The bus voltage is measured in accordance with a logic which determines the condition of the contact and the condition of expected input devices at the contact. Data signals for functional testing of the device under test are can be applied to the bus through an isolating driver which preserves the logic of the contact test.

3 Claims, 15 Drawing Sheets

CONTACT TEST MODES, PHASE 1

CONTACT TEST MODES, PHASE 1

CONTACT TEST MODES, PHASE 2

CONTACT TEST MODES, PHASE 2

FIG. 9 TSNOTK TRI-STATE NOT

FIG. 10  pdisod2: PIN DRIVER ISOLATOR levltrns0: Logic Level Translator.
Input=0V to +3.3V logic.
Output=0V to +VUPP pdbiasgen3: Negative Voltage Generator for pdisodd pin driver series PFET.

ISOLATOR WAVEFORMS

CONTACT TEST CIRCUIT

DESCRIPTION

This application is a divisional of prior application serial number 08/942,217 filed on Oct. 1, 1997, entitled CONTACT TEST CIRCUIT, (now U.S. Pat. No. 6,087,841) which is incorporated herein by reference.

BACKGROUND OF THE INVENTION

1. Field of the Invention

The present invention generally relates to assuring that there is electrical contact between test probes and input/output pads of an integrated circuit device, prior to testing of the functional characteristics of the integrated circuit. More specifically, the invention relates to an apparatus and method for determining whether there is electrical contact between test probe and pad where the tester has no power supply more negative than the most negative power supply rail of the circuit being tested, and where the test current must flow through electrostatic discharge (ESD) diodes whose polarity requires that a contact test signal more negative than the most negative rail of the circuit under test be applied by the probe to the pad.

2. Background Description

When a tester is to be used to test integrated circuits on a wafer, all tester probes must be aligned exactly with the wafer I/O pads to assure meaningful tests. A group of the I/O pads may be devoted to one of many dice on the wafer in order to test the functionality of that particular die. More than one die may be tested at a time by allocating other groups of I/O pads to individual dice. Each good die ultimately will be packaged and sold as a unit. Throughout the following discussion, each die will be referred to as a DUT (device-under-test.) The rapid and simultaneous contact alignment verification of hundreds or thousands of test probes per wafer is a substantial contributor to DUT test time reduction and the concomitant reduction in price per good DUT. The trend toward larger wafers with increased pad densities makes automatic alignment sensing and verification a very desirable tester feature.

During contact alignment verification between test probes and wafer or DUT I/O pads, it is preferred to determine the validity of the connection by measuring an electrical response, such as input impedance, directly on the pad with no dependency on circuits residing interior to the DUT I/O. Such a contact test method should exploit existing DUT pads and I/O devices that serve the intended DUT I/O function, and should not require special I/O pads nor other devices devoted exclusively to contact alignment verification. The contact test method should be independent of internal DUT errors or failures.

There is a limited set of devices on the typical DUT that lend themselves to simple impedance analysis. Many of the I/O pads connect to gates of FETs which have a fundamentally capacitive impedance. It would be difficult to distinguish between the capacitive impedance of a FET gate and the capacitance of I/O wiring. Thus FET gates do not represent a practical impedance to use for contact verification. The impedance at these I/O pads is so high that there is a considerable risk that electrostatic voltages incurred during normal DUT handling will be large enough to break down the gate oxide and render the DUT useless. To dissipate these potentially destructive voltages, ESD diodes are connected in parallel with most I/Os on the DUT in either of two configurations. If only one ESD diode is used at an I/O pad, it is connected to conduct to the most negative rail when an ESD event drives the I/O pad negative with respect to the most negative rail of the DUT. If a second ESD diode is used, it is connected to conduct to the most positive rail when an ESD event drives the I/O pad positive with respect to the most positive rail of the DUT. The ESD diodes are the most commonly expected DUT I/O structures that are simple to measure as two terminal impedances. It is common practice to use ESD diodes for contact alignment verification.

Previous methods used for contact test most commonly depended on an ESD diode from the I/O pad to the negative rail of the DUT, and a power supply in the tester that was more negative than the most negative rail in the DUT. For each test probe that made proper contact, a direct current from the negative supply passed through that probe to the contacted DUT I/O pad, then through one or more corresponding ESD protection diodes on the DUT to the return path of the negative supply. If a test probe did not make contact, there was no current through the probe. The tester used the presence of current in each probe as an indication that contact was made through the implied impedance of one or more ESD diodes. The polarity of the ESD diodes imposed the requirement for a contact test signal from the tester that was more negative than the most negative rail of the DUT. Previous contact test circuits have used a current that is constant (dc) throughout the duration of contact test.

Often the only reason for the more negative power supply is for use in contact test. If the tester-to-DUT interface is comprised of integrated circuits (ICs) that normally require no negative power supply, the most negative power supply rail used by the tester ICs (often ground) must be connected temporarily to a negative supply to generate a negative dc contact test signal for the ESD diodes. The temporary connection may be made by means of a relay or switch. Once contact test is complete, the negative rail of the tester is restored to ground during functional testing of the wafer or DUT.

The necessity for switching the most negative rail of the tester to a more negative supply during contact test, then back to its normal value, slows DUT testing and may introduce objectionable impedance into the negative rail connection. It is desirable that any probe contact test and alignment verification method should avoid such switching.

SUMMARY OF THE INVENTION

It is therefore an object of the present invention to provide a contact test circuit for ICs which operates without a power supply that is more negative than the most negative rail of the DUT.

It is also an object of the invention to provide a contact test circuit which operates without switches or relays.

It is a further object of the invention to provide a contact test circuit which can be used on DUTs without having to temporarily connect the most negative rail of the tester to a power supply more negative than the most negative rail of the DUT during contact test.

It is another object of the invention to provide a means for verifying the simultaneous alignment of multiple test probes.

It is an additional object of the invention to provide information on the condition of the DUT ESD diodes at each pad and indicate which probes might be shorted to ground.

It is also an object of the invention to provide automatically, either sequentially or simultaneously, for alignment and verification of multiple test probes.

Another object of the invention is to distinguish between probes that are shorted to ground, open, or connected to I/O pads of the DUT.

A further object of the invention is to distinguish between ESD diodes that are shorted, open or functioning properly.

It is also an object of the invention to distinguish between ESD diodes that are connected to ground or connected to the DUT power supply.

It is an additional object of the invention to accommodate different ESD diode specifications.

Another object of the invention is to provide protection against excessive current in probes that are improperly connected.

A further object of the invention is to provide low power dissipation through the ESD diodes.

It is also an object of the invention to provide isolation between contact test and tester data drivers on I/O.

A contact test circuit in accordance with the invention does not evaluate the current through DUT ESD diodes directly as dc. Instead the invention simulates a mini-ESD event at each I/O pad by means of a negative-going pulse, then stores as a voltage on a capacitor information about the history of events that took place during contact test as the result of the presence or absence of DUT ESD diodes. Evaluation of the resulting response of the test circuit occurs after the mini-ESD event is complete.

By this means, evaluation can be performed on voltages that are positive with respect to ground and no negative power supply is required to power negative voltage evaluation circuits. Neither is there a need to switch the negative rail of the tester by means of relays or other switching devices. The most negative rail of the tester remains connected to the most negative rail of the DUT during all testing, including contact test. In addition to verifying the simultaneous alignment of multiple probes, multiple instances of the circuit described provide information on the condition of the DUT ESD diodes at each pad and indicate which probes might be inadvertently shorted to ground. The invention offers low power dissipation due to a short duty cycle and low current pulse in the ESD diodes. Alignment and verification of multiple test probes can proceed either sequentially or simultaneously. If performed simultaneously, the speed of the contact test is enhanced greatly.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
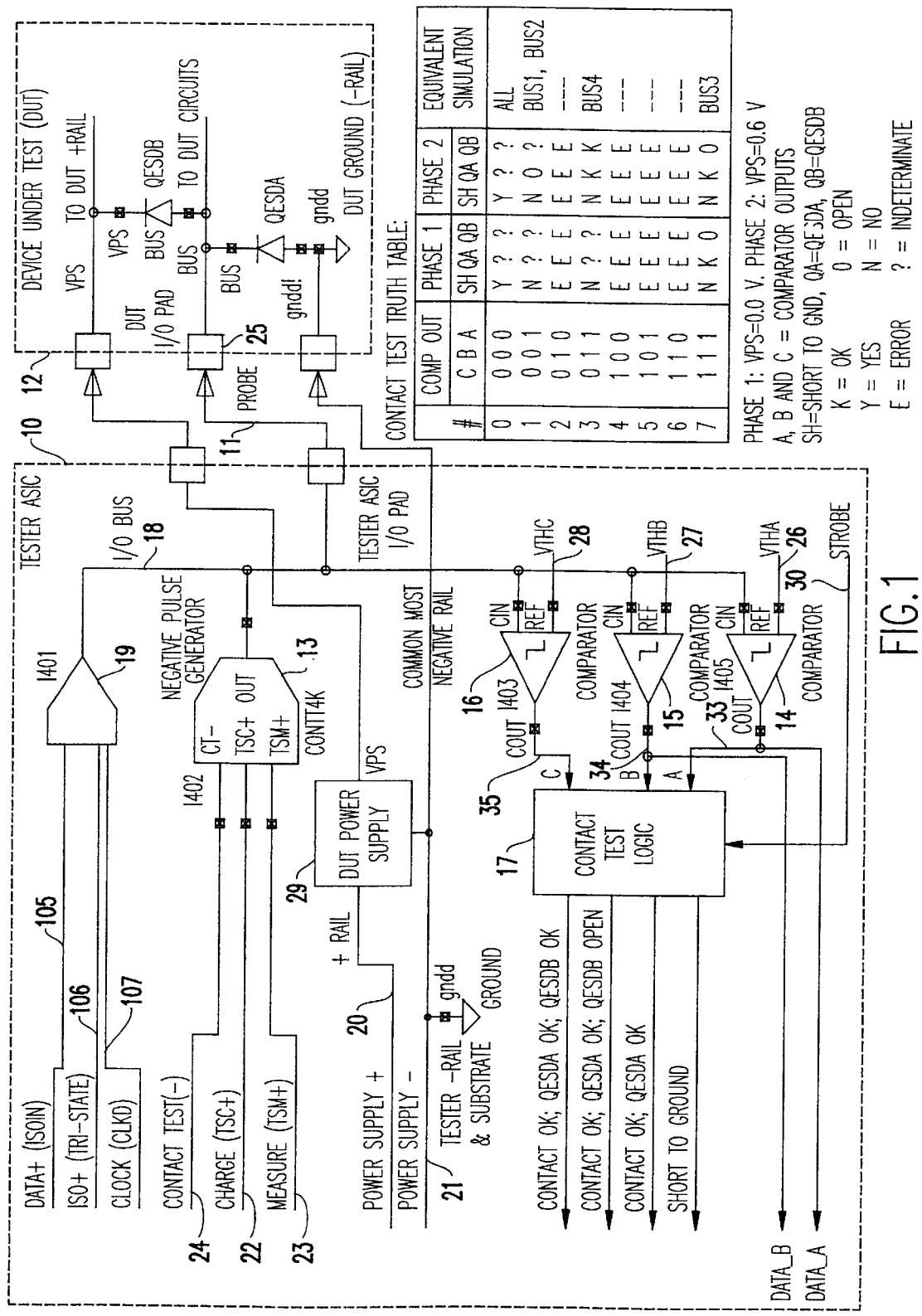
FIG. 1 is a block diagram of a contact tester in operation with a device under test.

Referring now to the drawings, and more particularly to FIG. 1, there is shown a typical interface between a test device 10, a test probe 11, and a device under test (DUT) 12. Although only one probe connection 11 is shown, many more identical simultaneous connections may exist. Tester 10 is constructed in accordance with the invention, and in the best mode this circuitry is implemented in a single integrated circuit (ASIC) that includes a NEGATIVE PULSE GENERATOR 13 (designated as CONTT4K in the figures), COMPARATORS 14, 15 and 16, and CONTACT TEST LOGIC 17. The pulse generator 13 is used only for contact test. The pulse generator 13 assumes a high impedance state when contact test is ended so that it does not load the I/O Bus 18 during normal data transmission. The COMPARATORS 14, 15 and 16 may be used for contact test, but their main function is for sensing normal data on the I/O BUS 18. CONTACT TEST LOGIC 17 evaluates the results of contact test. The ISOLATING DATA DRIVER 19 serves to isolate any data driver circuits on ISOIN 105 that might behave adversely if subjected to the negative contact test pulse that appears on I/O BUS 18. In DUT 12 one or two ESD diodes (QESDA and QESDB) serve to protect inputs to circuits on the DUT 12 that are not shown. Some DUT 12 designs provide only one of the two ESD diodes on each I/O. Connection to at least one of the two ESD diodes is required to verify test probe 11 alignment with each DUT I/O pad 25.

The tester ASIC 10 is powered by POWER SUPPLY+ 20 and POWER SUPPLY– 21 rails. POWER SUPPLY (–) 21 is shown grounded in FIG. 1. More generally in the contact test method described herein, POWER SUPPLY (–) 21 is permanently connected in common to the most negative rail of both TESTER ASIC 10 and DUT 12, whether or not that common most negative rail is ground. Throughout the following discussion, the common most negative rail may be referred to as ground for convenience, but it is to be understood that the contact test circuit will perform as described even if the most negative rail is set at a voltage more negative than ground.

Logic inputs CHARGE 22 (TSC+) and MEASURE 23 (TSM+) must both go LOW (logic level 0) to initiate the contact test mode. On command by logic input CONTACT TEST (–) 24, the NEGATIVE PULSE GENERATOR 13 delivers a short negative voltage pulse to the PROBE 11, via the I/O BUS 18 (to be called BUS). If the PROBE 11 is in contact with the DUT I/O pad 25, QUESDA will conduct and clamp the negative pulse one diode drop below ground.

Typical contact test waveforms in this situation for CHARGE (TSC+) 22, MEASURE (TSM+) 23, CONTACT TEST (CT−) 24, TSCT−31, and BUS 18 are shown in FIGS. 3A, 3B, 3C, 3D and 3E, respectively.

If the PROBE 11 is not in contact with the DUT I/O PAD 25, the negative pulse will extend below ground by substantially more than one diode drop. At the end of the negative pulse, the output of pulse generator 13 on the BUS is restored to a positive voltage of an amplitude that is dependent on the history of the excursion of the negative pulse below ground.

Test Phase 1 and 2

Contact test is conducted in two phases. Phase 1 determines whether or not each probe is shorted to the most negative rail. Phase 2 determines (1) whether or not contact is made to the ESD diodes, and (2) the condition of the ESD diodes. Threshold voltages VTHA 26, VTHB 27 and VTHC 28 at the COMPARATOR inputs in FIG. 1 set thresholds for decision in both Phase 1 and Phase 2.

During Phase 1, the DUT POWER SUPPLY 29 is set at ground (VPS=0.0 V) to avoid excessive PROBE current in the event of an erroneously connected probe. Grounded probes prevent the BUS signal from rising above VTHA 26. Any grounded probe will produce a LOW level at the corresponding COMPARATOR outputs, as will now be described. If COMPARATOR 14 output A is at a LOW level when it is strobed during Phase 1, CONTACT TEST LOGIC 17 assumes that BUS 18 is shorted to ground. If COMPARATOR 14 output A 33 is HIGH (logic level 1), it is assumed that BUS 18 is not grounded.

Initial information on contact verification can be extracted from Phase 1 to determine if it is safe to go on to Phase 2. Definitive tests of the condition of the ESD diodes are deferred to Phase 2.

During Phase 2, VPS=0.6 V to provide a low-voltage, non-destructive bias for the ESD diodes that connect to the positive rail of VPS. Response of the DUT during Phase 2 is modified by VPS=0.6 V such that it is possible to distinguish between possible connections to the ESD diodes and also the condition of the diodes. COMPARATOR thresholds VTHA 26, VTHB 27 and VTHC 28 allow the COMPARATOR outputs A 33, B 34 and C 35 to be interpreted as shown in the truth table given in FIG. 1. Details of that interpretation are given below under Contact Test Truth Table.

Negative Pulse Generator

The NEGATIVE PULSE GENERATOR 13 (CONTT4K in FIG. 1) is the element that makes the present invention feasible. The NEGATIVE PULSE GENERATOR 13 is able to generate a negative pulse, then restore its BUS to a positive voltage that is contact dependent. The load presented to NEGATIVE PULSE GENERATOR 13 by the DUT during the negative pulse interval determines the particular value of the positive voltage attained after the negative pulse is completed. The contact-dependent results on the BUS 18 are captured using COMPARATORS 14, 15 and 16 in relation to positive reference voltage levels VTHA 26, VTHB 27, and VTHC 28. The contact-dependent dependent results are key to (1) performing contact test with no requirement for the most negative rail of the TESTER 10 to become more negative than the most negative rail of the DUT 12, and (2) allowing evaluation of the results to be performed at positive voltage levels even though the contact test pulse is negative.

Figure 2:
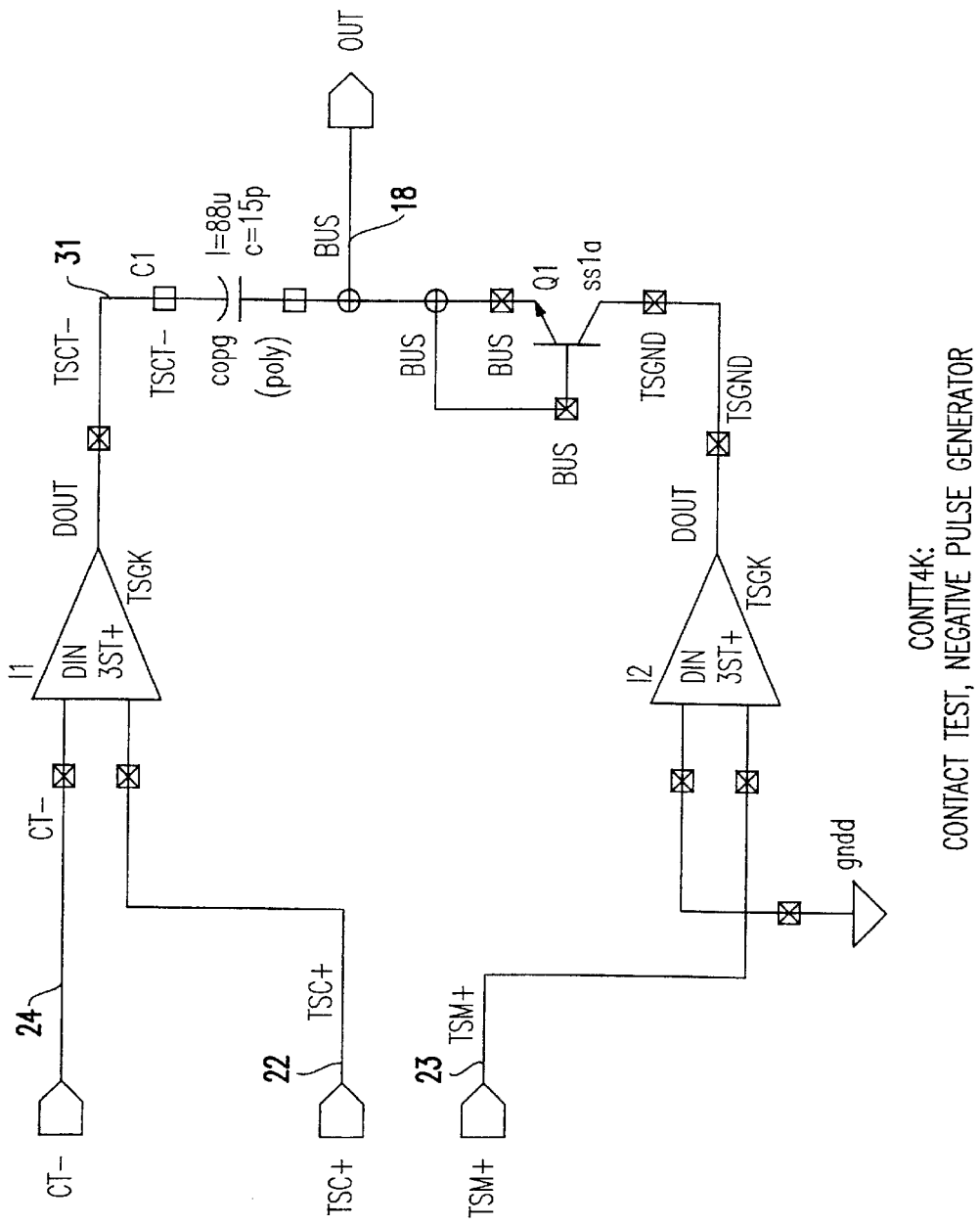
FIG. 2 shows a negative pulse generator shown as a block in FIG. 1.
Figure 3A:
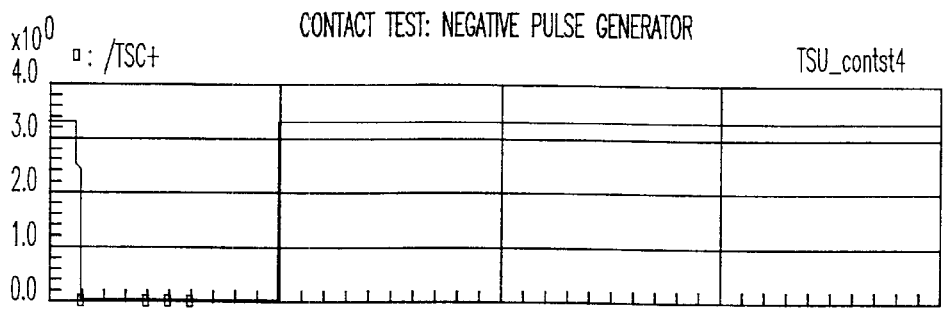
FIGS. 3A–3E show waveforms for the negative pulse generator inputs and output during Phase 1 of contact test where the contact test is affirmative (i.e. no short to the most negative rail and one or more good ESD diodes).
Figure 3B:
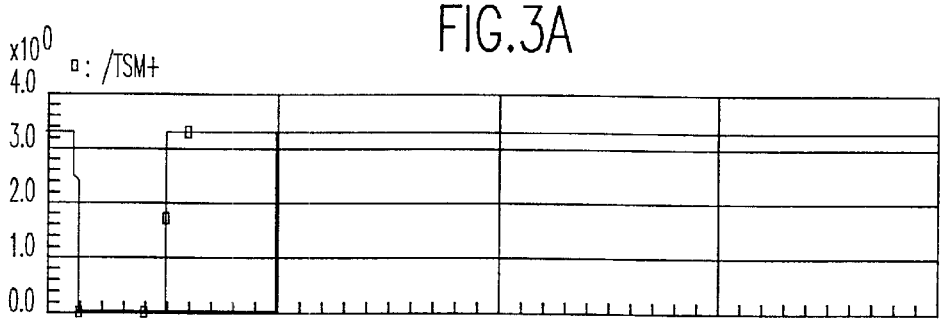
Figure 3C:
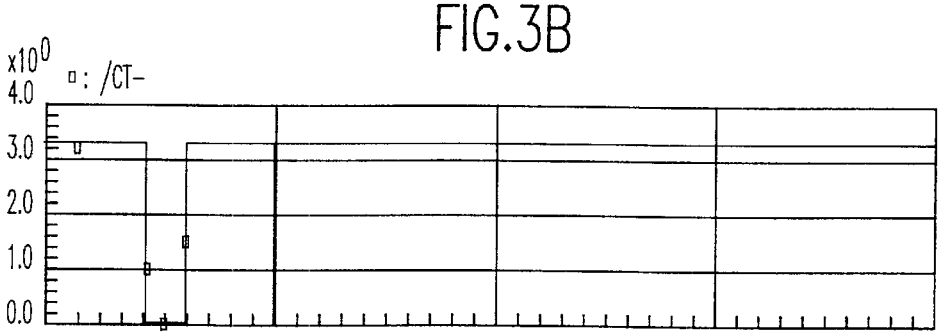
Figure 3D:
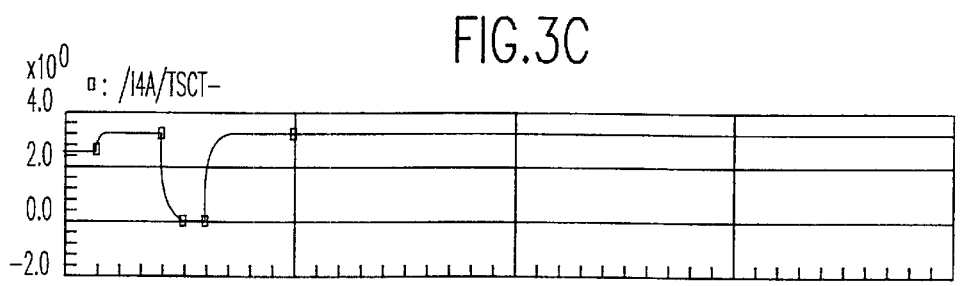
Figure 3E:
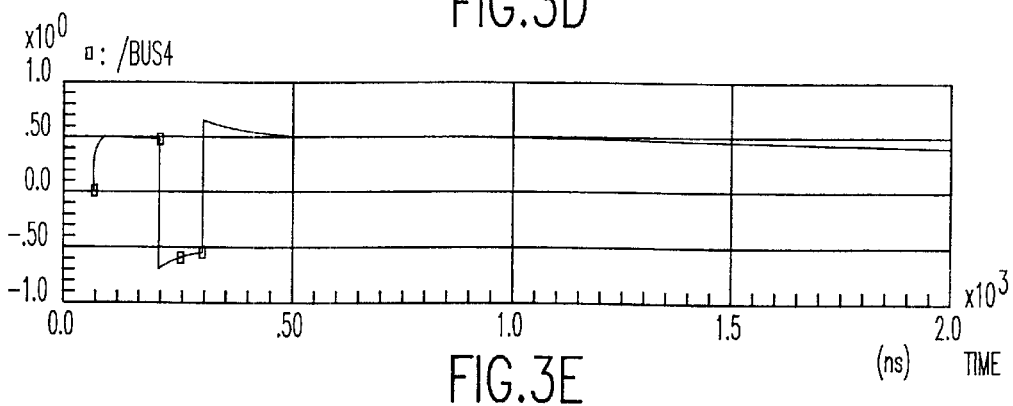
Figure 8:
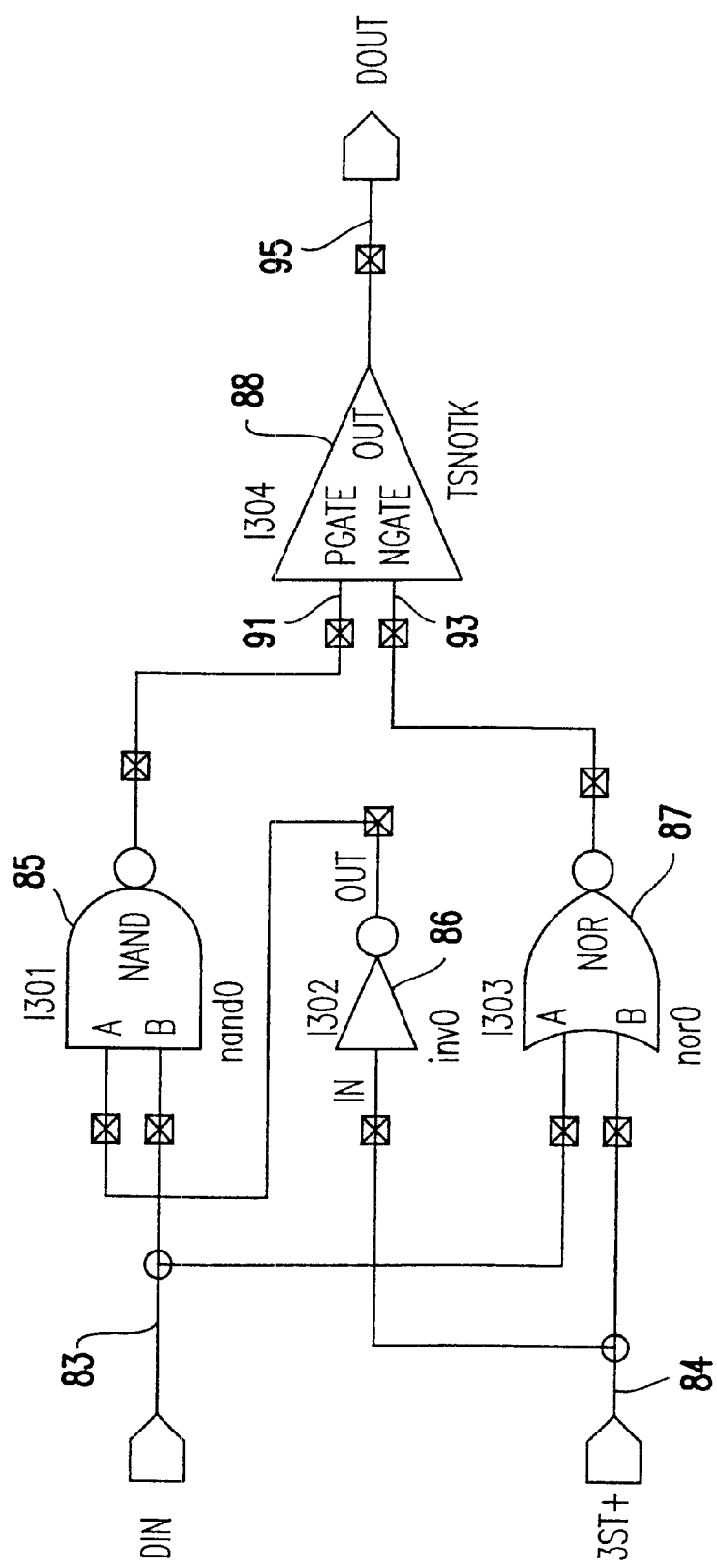
FIG. 8 is a block diagram showing a tri-state non-inverting driver.

Turning now to FIG. 2, there is shown a schematic of the NEGATIVE PULSE GENERATOR. C1 is a MOS capacitor with its polysilicon terminal connected to BUS 18. Q1 is a bipolar transistor connected as a base-collector diode with emitter connected to base. Both C1 and Q1 are inverted from their conventional orientation to enhance their ability to withstand negative voltage pulses at BUS 18. The two TSGK circuits I1 and I2 are tri-state non-inverting drivers, which are described in greater detail below in connection with FIGS. 8 and 9. Before and after contact test mode, the NEGATIVE PULSE GENERATOR 13 is in its tri-state (high-impedance) impedance) mode because TSC+ 22 and TSM+ 23 are both HIGH (logic level 1) so that both I1 and I2 are in tri-state mode. Assume that the ISOLATING DATA DRIVER 19 is also in a high-impedance mode during contact test. During Phase 1, the DUT POWER SUPPLY 29 (VPS) is set at 0.0 V until it is determined that no test probes are grounded in error. During Phase 2, VPS=0.6 V. Grounded probes are indicated by the voltage at BUS 18 remaining less than VTHA 26 throughout Phase 1 and Phase 2 of contact test.

Figure 4A:
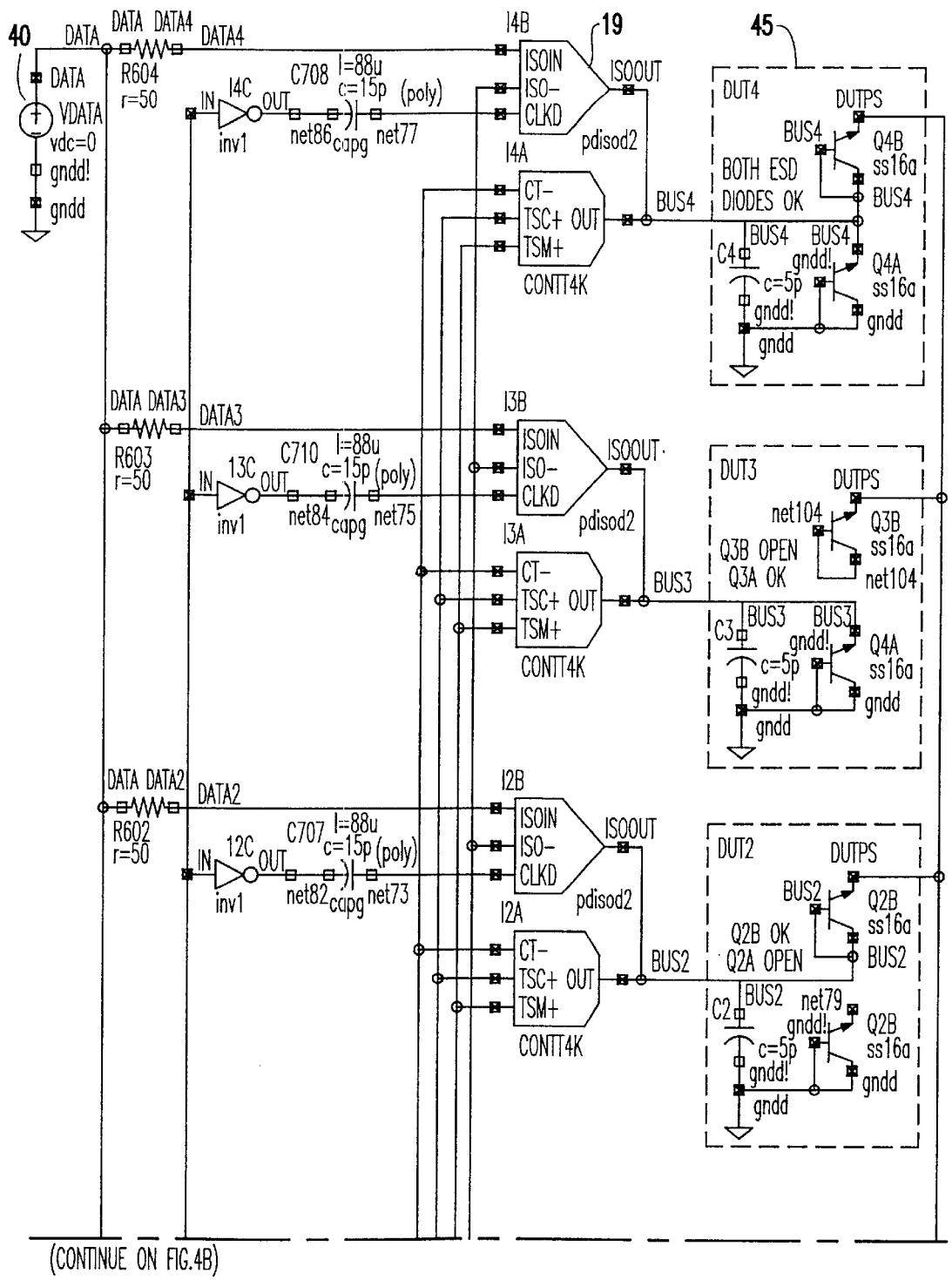
FIG. 4 is a diagram of a circuit simulating all four contact test modes which are possible in Phase 1 of a contact test.
Figure 4B:
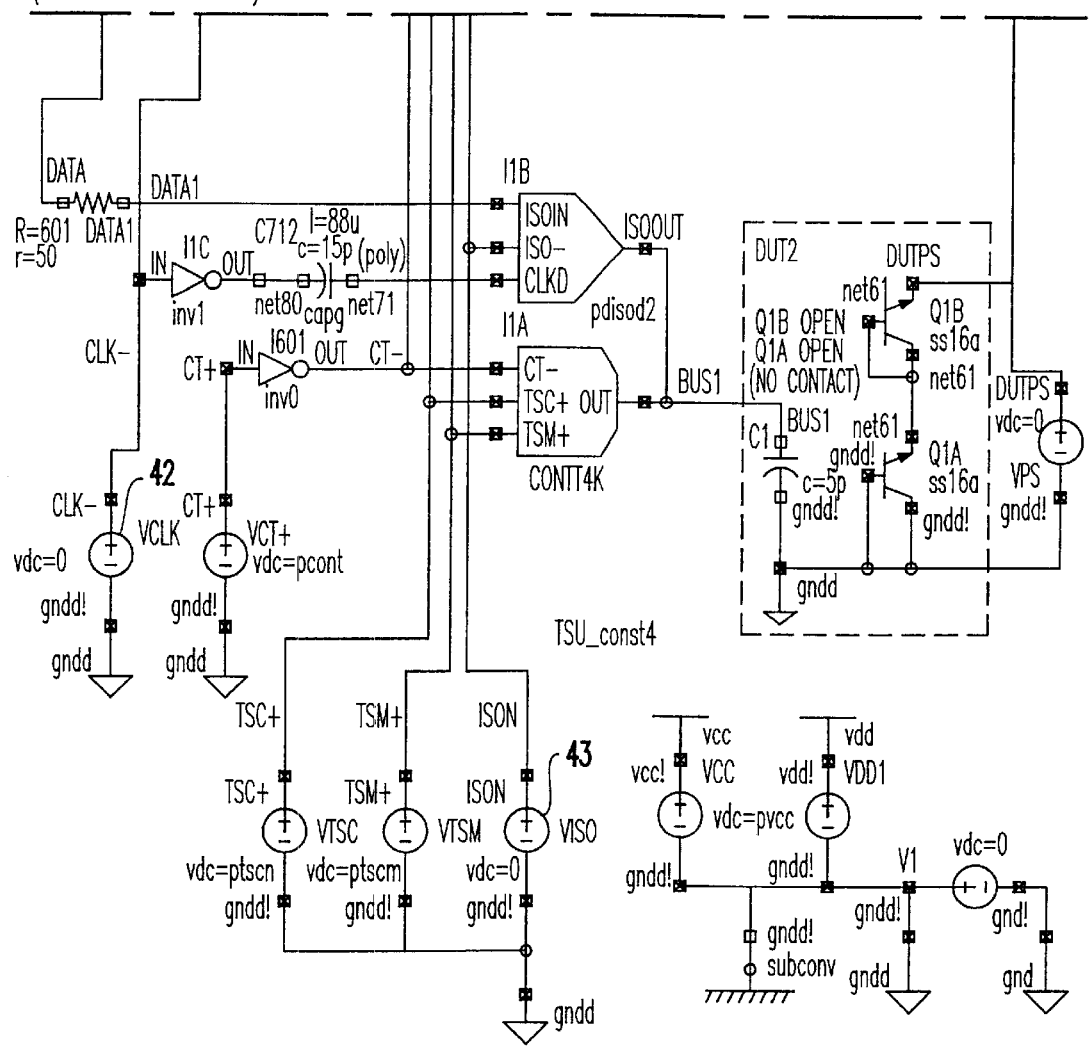
Figure 6A:
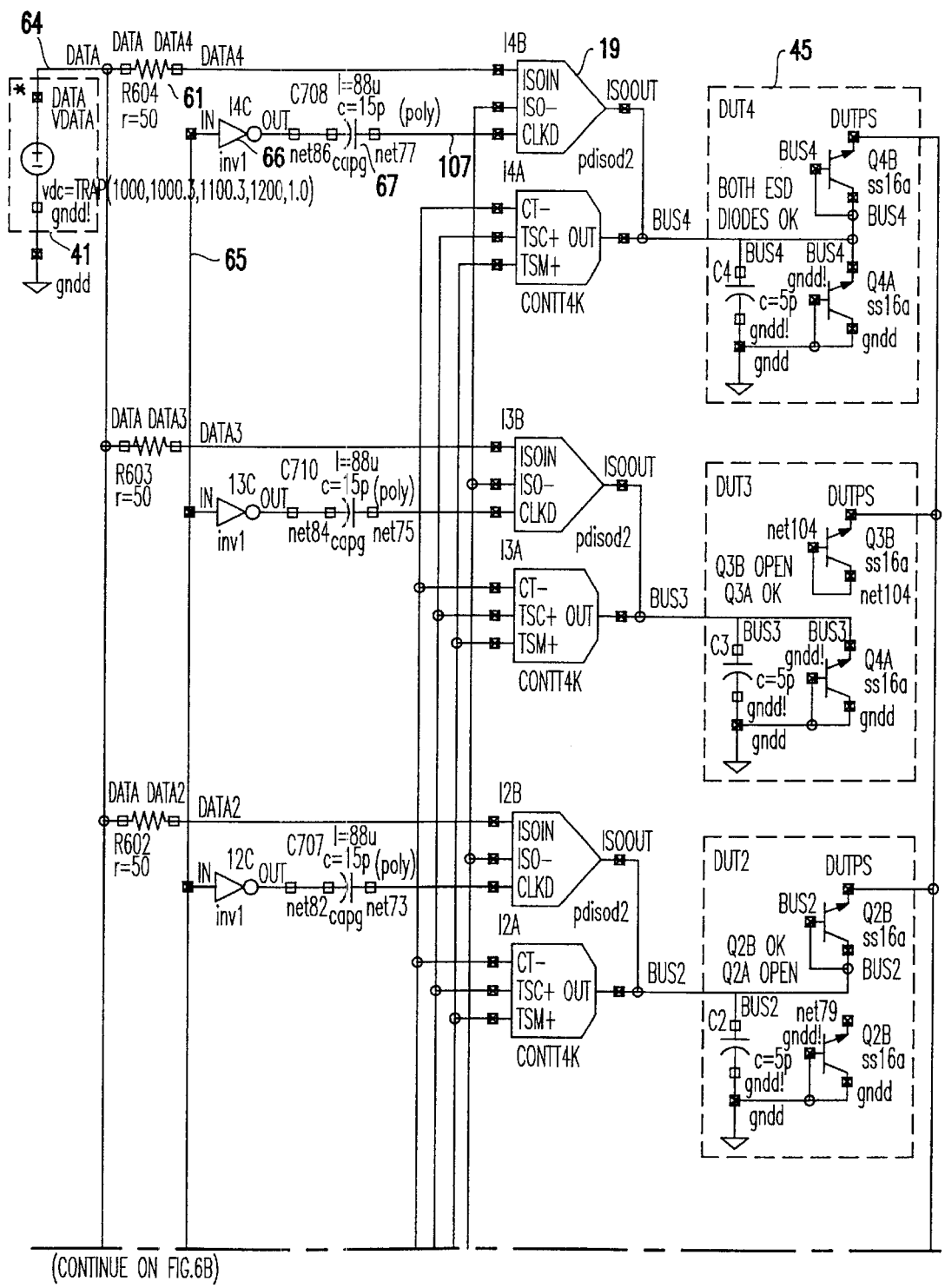
FIG. 6 is a diagram of a circuit simulating all four contact test modes which are possible in Phase 2 of a contact test.
Figure 6B:
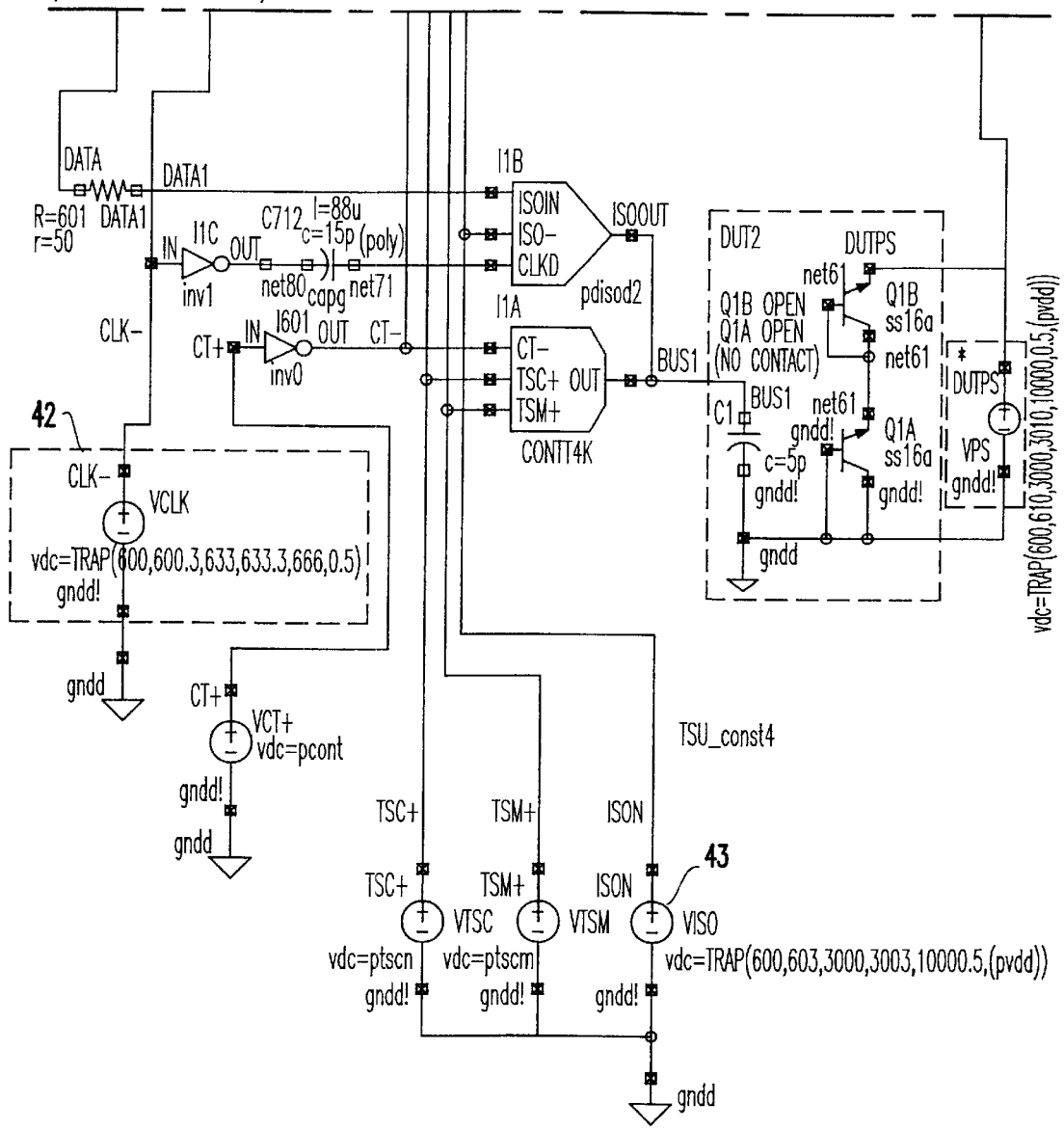

In the following discussion, assume that no probes are shorted to the most negative rail, VTHA 26 is exceeded, and A=1 at output 33 of COMPARATOR 14, which is an input to CONTACT TEST LOGIC 17, when the STROBE 30 occurs. FIGS. 4 and 6 show circuits used to simulate the four possible connections or missed connections between BUS 18 and ESD diodes QESDA and QESDB of the DUT shown in FIG. 1. For the purposes of explanation of the simulation circuitry of FIGS. 4 and 6, the ESD diodes QESDA and QESDB and BUS 18 are represented, respectively, for each of the four possible connection scenarios, as Q1A/Q1B/BUS1, Q2A/Q2B/BUS2, Q3A/Q3B/BUS3 and Q4A/Q4B/BUS4. In the first scenario, shown at BUS1, both ESD diodes are open. In the second scenario, shown at BUS2, Q2A is open and Q2B is connected. In the third scenario, shown at BUS3, Q3A is connected and Q3B is open. In the last scenario, shown at BUS4, both ESD diodes are connected.

Figure 5:
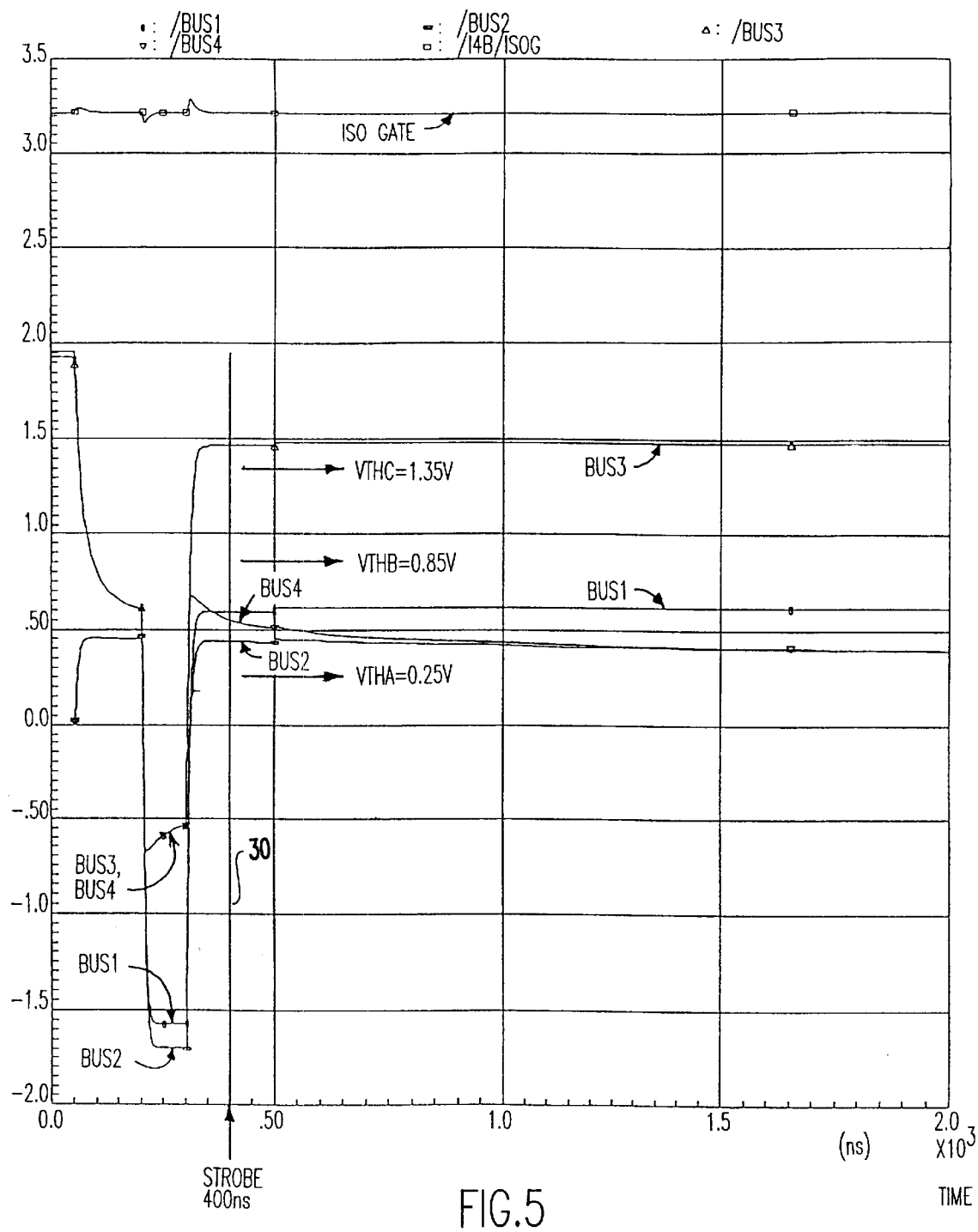
FIG. 5 is a series of waveforms showing voltages at the DUT I/O pad during Phase 1 of a contact test under each of the four contact test modes.
Figure 7:
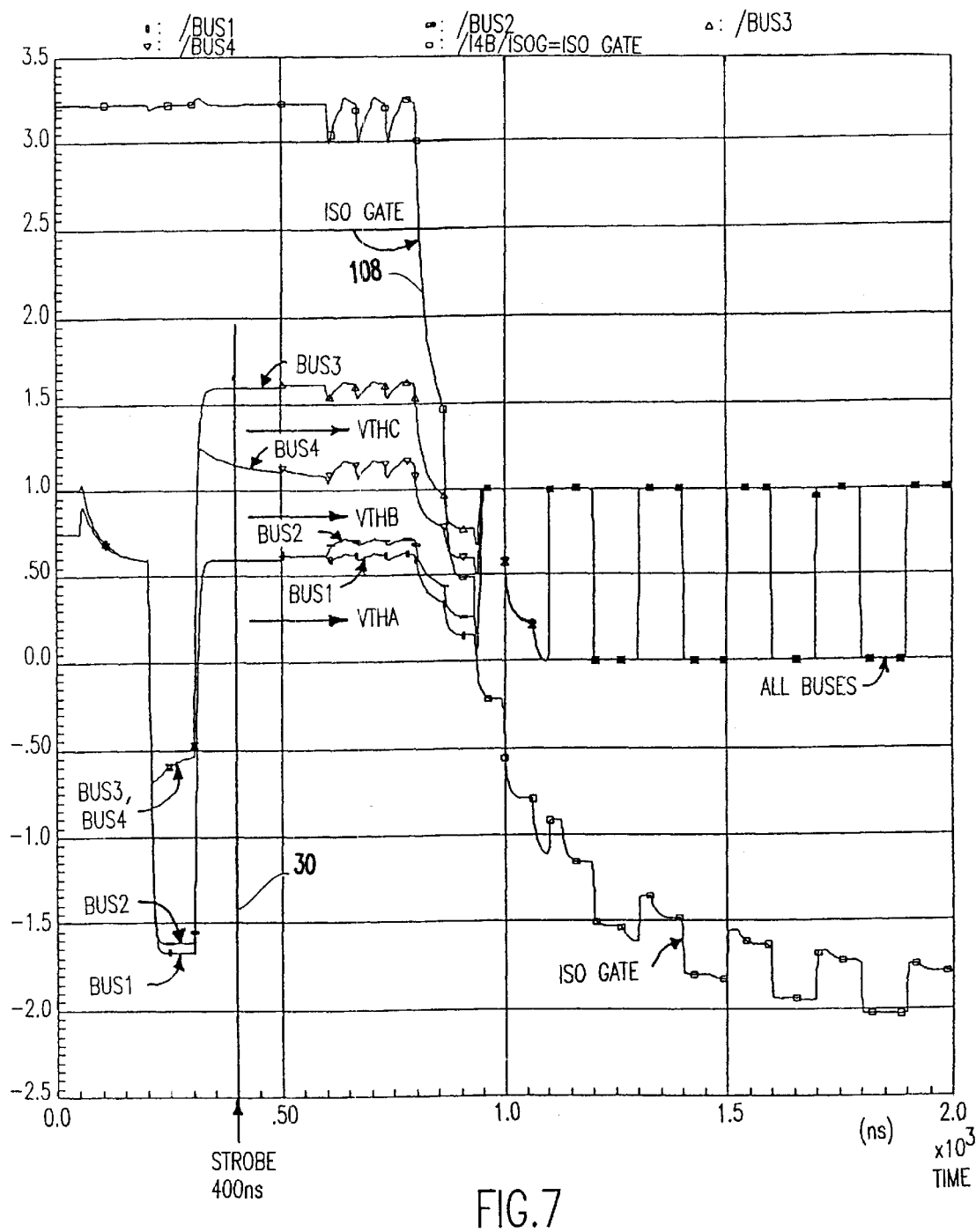
FIG. 7 is a series of waveforms showing voltages at the DUT I/O pad during Phase 2 of a contact test under each of the four contact test modes.

The relative timing and amplitude of key waveforms associated with contact test are illustrated in FIGS. 3, 5, 7 and 13. The waveforms depict the results of simulations of the four possible connections or missed connections between BUS1–BUS4 and DUT1–DUT4 ESD diodes that are shown in FIGS. 4 and 6. FIGS. 3, 4 and 5 relate to Phase 1 performance. FIGS. 6, 7 and 13 relate to Phase 2 performance. The COMPARATORS (14, 15 and 16) and CONTACT TEST LOGIC 17 are omitted in FIGS. 4 and 6, but one set is connected to each of BUS1–BUS4 in the manner shown in FIG. 1. Note that the four simulated situations share simultaneous test initiation commands.

The timing of the commands and the resulting responses is not critical as long as (1) sufficient time is allowed for the responses to attain a steady-state condition after each transition, and (2) the contact test pulses are short enough to have a negligible dc component at the desired repetition rate. The timing and responses shown in FIGS. 3, 5, 7 and 13 are representative of contact pulses that are suitable for the purposes of this description.

Figure 9:
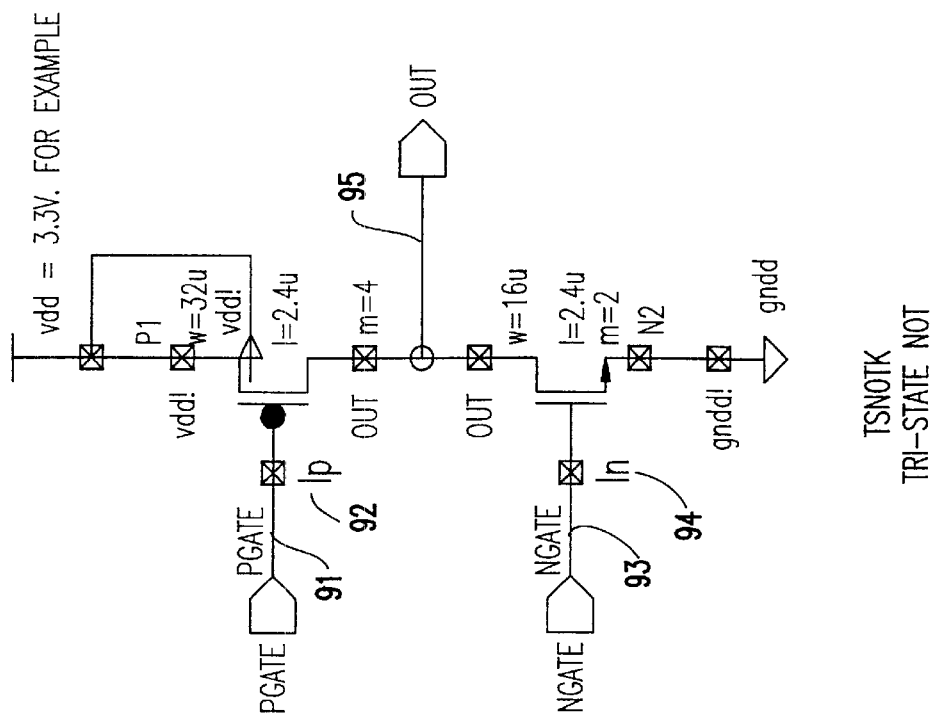
FIG. 9 is a detailed schematic of the tri-state NOT gate shown as a block in FIG. 8.

The NEGATIVE PULSE GENERATOR 13 in FIG. 2 includes two TSGK tri-state non-inverting drivers that maintain a high impedance at the NEGATIVE PULSE GENERATOR output until the contact test mode is initiated, when they deliver a negative pulse to the I/O BUS. Both TGSK drivers may be described in accordance with FIGS. 8 and 9. A tri-state HIGH level logic input signal 3ST+ 84 will be converted by NAND gate 85, NOR gate 87 and INVERTER 86 to force (1) a HIGH level at the PGATE input 91 of tri-state NOT gate 88, and (2) a LOW level at the NGATE input 93 of tri-state NOT gate 88, regardless of the condition of input DIN 83. As shown by FIG. 9, these levels will turn off both PFET 92 and NFET 94. As a result of neither PFET 92 nor NFET 94 conducting, TSNOTK output 95 resides at its tri-state or high-impedance state whenever 3 ST+84 is high. When 3 ST+ 84 is low, the DIN 83 signal passes through NAND 85, NOR 87 and NOT 88 to appear at NOT output 95.

In the following detailed description, assume that all voltages are measured with respect to the common most negative rail of the tester and DUT. Assume further that this common negative rail is grounded, although this need not be the case in practice. To initiate Phase 1 of contact test, VPS is set at 0.0 Volts, and tri-state inputs CHARGE 22 (TSC+) and MEASURE 23 (TSM+) both go LOW while CONTACT TEST(−) 24 input (CT−) is HIGH. The relative timing of these logic inputs is shown in FIG. 3. Pulse amplitudes on BUS1, BUS2, BUS3 and BUS4 are shown more clearly in FIG. 5 where the four possible simultaneous outcomes are overlaid. Returning now to FIG. 2, both Tri-State Gates I1 and I2 go out of tri-state mode. Terminal TSCT− 31 becomes HIGH and TSGND 32 becomes LOW. Diode-connected bipolar transistor Q1 conducts to charge C1 to approximately $$VC1 = V_{high} - V_{low} - Vd = 2.7 \text{ V},$$

where $V_{high}$=VDD=Logic 1 level=3.3 V In FIG. 9
$V_{low}$=Logic 0=ground in FIG. 9
Vd=forward drop across Q1 (0.6 V in FIG. 3)

When contact test pulse CT− goes from HIGH to LOW, TSCT− 31 in FIG. 2 follows. The bottom end of C1, or BUS 18, changes in a negative direction starting from about Vd. Diode Q1 in the NEGATIVE PULSE GENERATOR 13 becomes reverse biased by the negative-going pulse, and the BUS terminal 18 continues to go negative. With no load (no contact to ESD diodes) on the pulse generator 13, the negative excursion would be −VC1, or −2.7 V, and reach VD−VC1=0.6−2.7=−2.1 V. Parasitic capacitance reduces the negative excursion from −2.7 V to about −2.2 V so that BUS 18 goes from VD to VD−2.2=−1.6 V in the absence of a load. See BUS1 and BUS2 in FIG. 5. If the PROBE 11 contacts QESDA in FIG. 1, the extent of the negative excursion of BUS 18 is clamped by QESDA at about −Vd=−0.6 V. See BUS3 and BUS4 in FIG. 5.

Midway during the CT− 24 negative pulse, TSM+ 23 goes HIGH so that TSGK driver I2 in FIG. 2 goes into its high-impedance mode. This releases the bottom end of diode Q1 in FIG. 2 at TSGND so that Q1 cannot clamp BUS 18 when CT and TSCT− 31 return HIGH and drive BUS 18 to a HIGH level via C1. The open-circuit positive excursion is expected to be about the same as the open-circuit negative excursion, or about +2.2 V. If no contact is made by probe 11 to any of the ESD diodes (as simulated at BUS1 in FIG. 4), BUS 18 simply starts from its most negative extreme of −1.6 V and returns to its starting point of about 0.6 V (as shown for the BUS1 signal in FIG. 5). BUS 18 behaves in a similar manner where no contact is made to QESDA (as shown by no connection between BUS2 and Q2A in FIG. 4), but the positive excursion of BUS 18 is clamped at about 0.5 V by QESDB (as shown by the BUS2 waveform in FIG. 5, reflecting the connection between BUS2 and Q2B in FIG. 4). If contact is made to QESDA (as simulated by the connection between BUS3 and Q3A in FIG. 4), the positive excursion of BUS 18 starts from a pedestal of −0.6 V and continues unclamped to about 1.5 V (as shown by the BUS 3 waveform in FIG. 5, reflecting the contact between BUS3 and Q3A in FIG. 4). If contact is also made to QESDB (as simulated by the contact between BUS4 and Q4A in FIG. 4), BUS 18 behaves similarly but the positive excursion of BUS 18 is clamped at about 0.5 V by QESDB (as shown by the BUS4 waveform in FIG. 5, reflecting the contact between BUS4 and Q4B in FIG. 4). Where there is contact between BUS 18 and QESDB, Phase 2 must be used to determine whether there is also contact with QESDA (i.e. to distinguish between the BUS2 and BUS4 contacts simulated in FIG. 4) at the time of the strobe (shown as STROBE 30 at 400 ns in FIG. 5).

To initiate Phase 2, VPS is set at 0.6 V (as shown in FIG. 6), and the sequence of Phase 1 is repeated. Test results for each of the four connection scenarios (simulated at BUS1, BUS2, BUS3 and BUS4 in FIG. 6) is now shown in the waveforms of FIG. 7.

In FIG. 6 it is shown that BUS1 in DUT1 does not contact either of the ESD diodes Q1A and Q1B. In response to CT− 24 dropping to logic level 0, the voltage at BUS1 drops about 2.2 V below the starting point of 0.6 V to about −1.6 V, indicating the Q1A is not present to clamp BUS1 at 0.6 V. When CT− 24 returns to logic level 1, the voltage at BUS1 rises about as far as it dropped to return to about 0.6 V. At the time of the STROBE 30 pulse at 400 ns in FIG. 7, BUS1 is greater than VTHA=0.25 V, which indicates that BUS1 was not grounded in error. Also at the time of the STROBE 30 pulse, BUS1 is less than VTHB and VTHC, which indicates that BUS1 started is positive excursion from −1.6 V (implying that Q1A is open or not contacted.) The condition of Q1B cannot be determined when Q1A is open or not contacted.

The second option shown in FIG. 6 is that BUS2 in DUT2 contacts ESD diode Q2B, but not Q2A. In response to CT− 24 dropping to logic level 0, the voltage at BUS2 drops about 2.2 V below the starting point of 0.6 V to about −1.6 V, indicating that Q2A is not present to clamp BUS2 at −0.6 V. When CT− 24 returns to logic level 1, the voltage at BUS2 rises about as far as it dropped to return to about 0.6 V. At the time of the STROBE 30 pulse, BUS2 is greater than VTHA=0.25 v, which indicates that BUS2 was not grounded in error. Also at the time of the STROBE 30 pulse, BUS2 is less than VTHB and VTHC, which indicates that Q2B started its positive excursion from −1.6 V (implying that Q2A is open or not contacted.) The condition of Q2B cannot be determined when Q2A is open or not contacted.

The third option shown in FIG. 6 is that BUS3 in DUT 3 contacts ESD diode Q3A, but not Q3B. In response to CT− 24 dropping to logic level 0, the voltage at BUS3 drops below the starting point of 0.6 V until it is clamped by Q3A at −0.6 V. When CT− returns to logic level 1, the voltage at BUS3 rises about 2.2 V to reach 1.6 V. At the time of the STROBE 30 pulse, BUS3 is greater than VTHA=0.25 v, which indicates that BUS3 was not grounded in error. Also at the time of the STROBE 30 pulse, BUS3 is greater than VTHB and VTHC, which indicates that BUS3 started its positive excursion from −0.6 V (implying that Q3A is contacted), and ending at 1.6 V (implying that Q3B is not contacted).

The fourth option shown in FIG. 6 is that BUS4 in DUT4 contacts ESD diode Q4A and also Q4B. In response to CT− 24 dropping to logic level 0, the voltage at BUS4 drops below the starting point of 0.6 V until it is clamped by Q3A at −0.6 V. When CT− 24 returns to logic level 1, the voltage at BUS4 rises until it is clamped by Q4B at VPS+Vd=0.6+

0.6=1.2 V. At the time of the STROBE 30 pulse, BUS4 is greater than VTHA=0.25 V, which indicates that BUS4 was not grounded in error. Also at the time of the STROBE 30 pulse, BUS4 is greater than VTHB but less than VTHC, which indicates that Q4B started its positive excursion from −0.6 V (implying that Q4A is contacted), and ending at 1.2 V (implying that Q4B is contacted).

Contact Test Truth Table

The outputs of the COMPARATORS (outputs A, B and C as shown in FIG. 1) are interpreted by the CONTACT TEST LOGIC 17 for each BUS 18 scenario. The following truth table summarizes the outcomes from Phase 1 and Phase 2 tests. Note that an error is implied if C=1 while either B=0 or A=O, since VTHC 28 cannot be exceeded unless VTHA 26 and VTHB 27 are also exceeded. Similarly, an error is implied if B=1 while A=0 since VTHB 27 cannot be exceeded unless VTHA 26 is also exceeded.

| Test No. | Comparator Outputs | | | Phase 1 | | | Phase 2 | | | Equivalent Simulation |
|---|---|---|---|---|---|---|---|---|---|---|
| | C | B | A | SH | QA | QB | SH | QA | QB | |
| 0 | 0 | 0 | 0 | Y | ? | ? | Y | ? | ? | ALL |
| 1 | 0 | 0 | 1 | N | ? | ? | N | O | ? | BUS1, BUS2 |
| 2 | 0 | 1 | 0 | E | E | E | E | E | E | — |
| 3 | 0 | 1 | 1 | N | ? | ? | N | K | K | BUS4 |
| 4 | 1 | 0 | 0 | E | E | E | E | E | E | — |
| 5 | 1 | 0 | 1 | E | E | E | E | E | E | — |
| 6 | 1 | 1 | 0 | E | E | E | E | E | E | — |
| 7 | 1 | 1 | 1 | N | K | O | N | K | O | BUS3 |

In the foregoing table, the column labels for the Phase 1 and Phase 2 results have the following meanings: SH=SHort to ground; QA=ESD diode to ground; QB=ESD diode to VPS. The values for the Phase 1 and Phase 2 results have the following meanings: Y=short to ground; N=no short to ground; K=OK (contact made to ESD diode); O=Open (no contact made to ESD diode); ?=indeterminate result; E=Error (result not possible).

As is evident from the table, the desired result is shown in Test No. 3.

Isolating Data Driver

The above description of the operation of the contact test circuit of the invention is complete if the I/O BUS 18 need not carry data when contact test is idle because the ISOLATING DATA DRIVER can be omitted. But when the I/O BUS 18 must be time-shared between contact test and data transmission, care must be taken to see that the data driver does not load the contact test mode and yield false information.

For example, suppose that a conventional tri-stated CMOS data driver were used to drive BUS 18. The operation of tri-state non-inverting drivers is well known in the art, and was explained earlier with reference to FIGS. 8 and 9. It will be recalled from that earlier discussion that when the tri-state control signal 3ST+ is high, both FETs in the tri-state NOT gate shown in FIG. 9 are turned off. In this state, with both FET 1P 92 and FET 1N 94 shut off, the tri-state driver should be isolated from its output 95. Suppose that this circuitry is therefore used to isolate the data driver from the BUS 18. There would then be a connection between output 95 and BUS 18. However, the drain of FET 1N 94 would then be directly connected to BUS 18. Even if the gate of FET 1N 94 were grounded to turn off the NFET (FET 1N 94), a negative pulse from the NEGATIVE PULSE GENERATOR 13 that appears on BUS 18 would tend to turn on this NFET, thereby producing a false indication of contact. This tendency would apply as well to alternative circuitry involving an NFET whose drain is connected to BUS 18.

Figure 10:
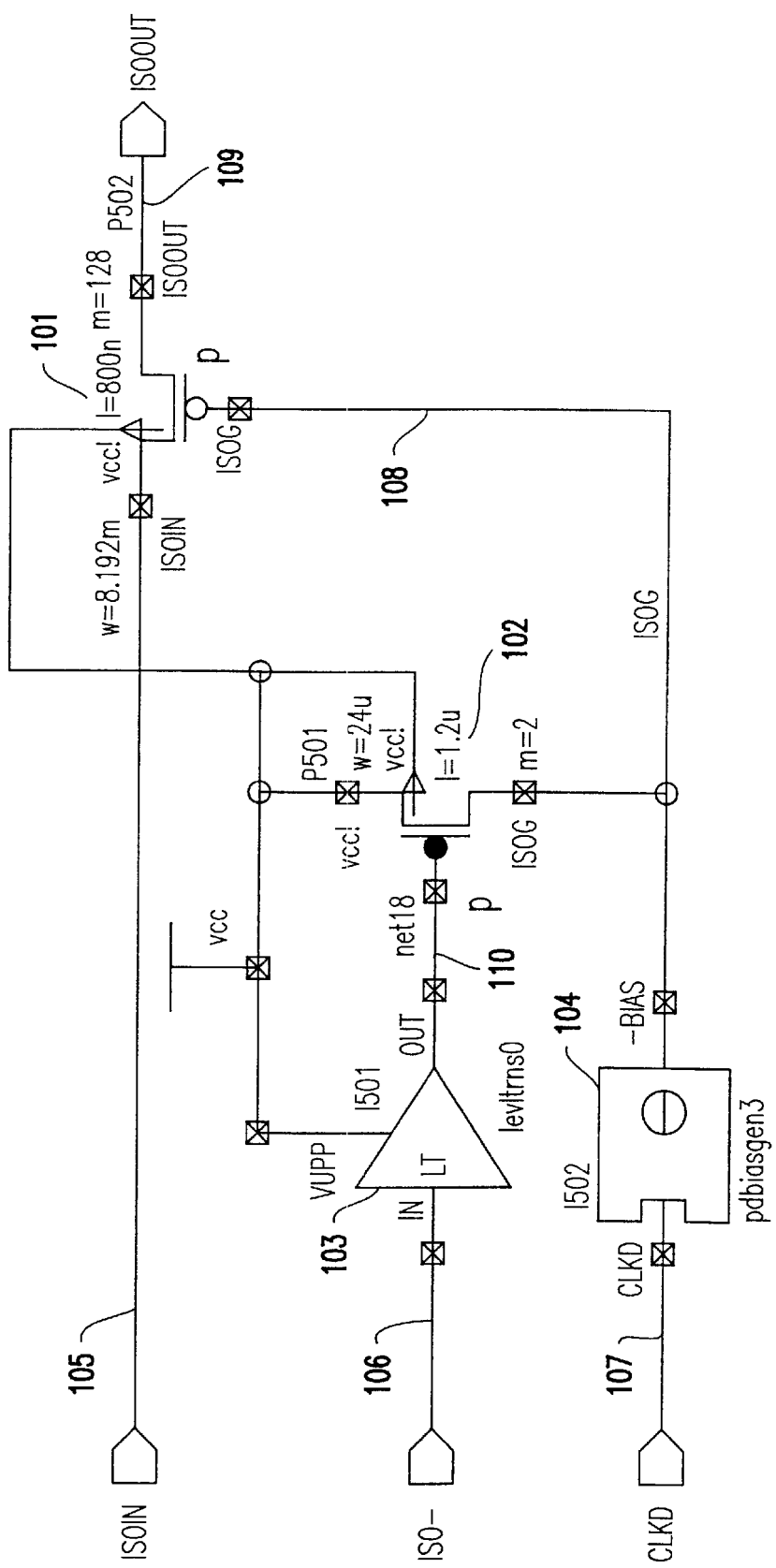
FIG. 10 is a circuit diagram for an isolating data driver shown as a block in FIG. 1.

These false indications of contact are avoided by the ISOLATING DATA DRIVER 19, shown in FIG. 1 and also shown in FIGS. 4 and 6 as I1B–I4B (pdisod2). The ISOLATING DATA DRIVER 19 includes the PIN DRIVER ISOLATOR shown in FIG. 10. PFET 101 (P502 ) in FIG. 10 is a large PFET transmission gate placed in series between any data driver and BUS 18. Since there is no NFET in this transmission gate, the gate remains off when negative pulses appear on BUS 18. But a new problem is introduced by the lack of an NFET in parallel with the PFET 101 as would be the case in a conventional transmission gate. Suppose the gate of PFET 101 (P 502 ) in FIG. 10 is grounded in an attempt to turn on PFET 101. When the data signal at ISOIN 105 in FIG. 10 approaches ground, VGS of PFET 101 approaches 0.0 V and the transmission gate turns off. To keep PFET 101 turned on, it is necessary to drive its gate with a negative voltage.

Contact test, as illustrated in FIG. 4, kept logic signals VDATA 41, VCLK 42 and VISO 43 at LOW levels all during Phase 1. These signals are common to all DUT's in FIGS. 4 and 6, but since DUT4 45 is the only DUT with all good ESD diode connections, DUT4 45 will be used to illustrate the normal operation of an ISOLATING DATA DRIVER 19. In the ISOLATING DATA DRIVER 19 (pdisod I4B) associated with DUT4 45, signal I4B/ISOG (shown as ISO GATE at the top of FIG. 5 and as ISOG 108 in FIG. 10) is driven HIGH by VISO 43 in the absence of VCLK 42. I4B/ISOG 108 connects to the gate of PFET 101 in FIG. 10 where a HIGH level keeps PFET 101 turned off. In Phase 2, as illustrated by FIG. 6, VDATA 41, VCLK 42 and VISO 43 were kept LOW until 600 ns when Phase 2 was complete. FIG. 7 shows the transition from contact test, Phase 2, to normal data transmission. The transition extends from 600 ns to about 1,000 ns in FIG. 7. The I4B/ISOG 108 signal shown in FIGS. 7 (as ISO GATE) and 13C changes from the isolation mode at about 3.2 V to the transmission mode at about −1.0 V and beyond.

Figure 11:
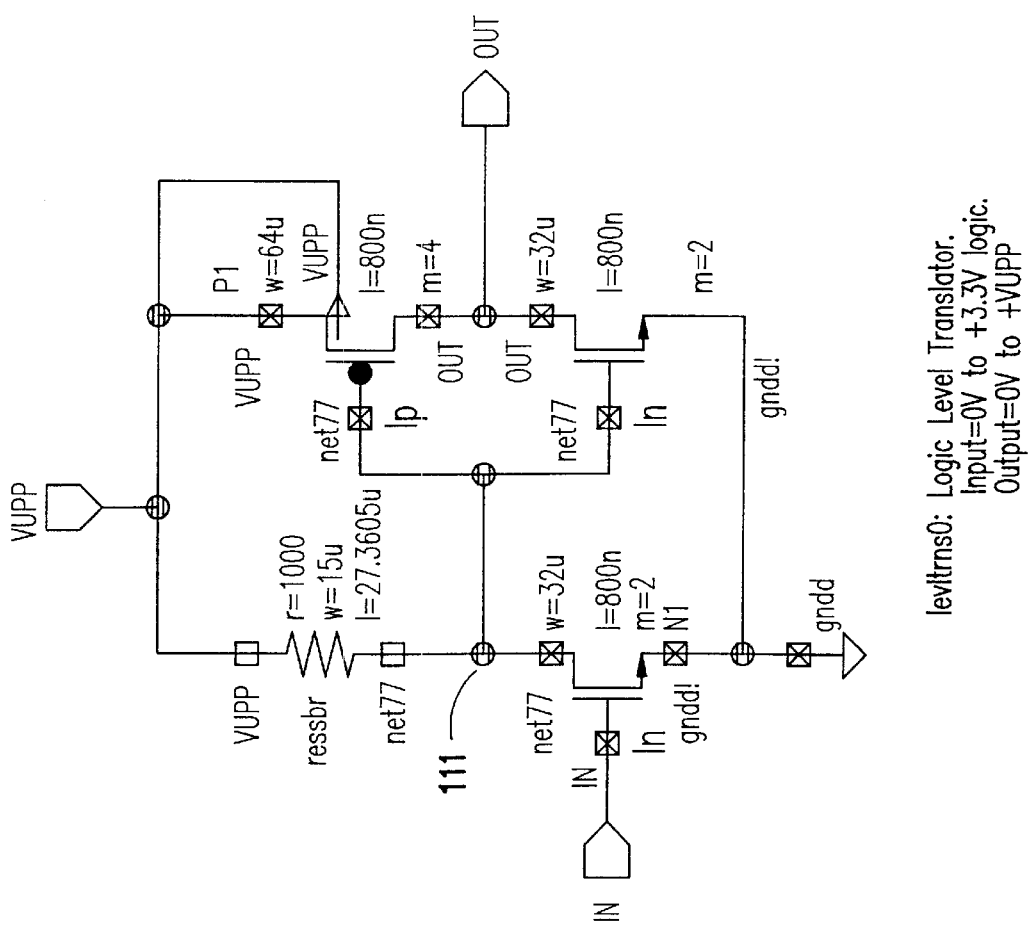
FIG. 11 is a circuit diagram for a logic level translator shown as a block in FIG. 10.

When the ISOLATING DATA DRIVER 19 is to be turned off (during both phases of contact test) VISO output ISON in FIGS. 4 and 6 is held LOW. The ISO− input 106 to the PIN DRIVER ISOLATOR in FIG. 10 turns on PFET 102 via LEVEL TRANSLATOR 103 (I501) to pull I4B/ISOG 108 to a HIGH level and turn PFET 101 off to isolate ISOIN 105 from ISOOUT 109. Negative pulses on BUS 18 during contact test cannot pass backward through the ISOLATING DATA DRIVER 19. LEVEL TRANSLATOR 103 as shown in FIG. 11 illustrates one of many techniques well-known in the art for translating the standard logic levels at ISO− 106 to logic levels of ground and VCC that accommodate the particular gate drive requirements for PFET 102 (P501).

When the ISOLATING DATA DRIVER 19 is to be turned on for normal data transmission starting at 600 ns, ISON in FIGS. 4 and 6 changes from LOW to HIGH and 14/ISOG 108 in FIG. 10 is no longer held HIGH by PFET 102 (P501). The 5.0 MHZ signal VCLK 42 is gated on aid clock signals pass through C712, C707, C710 and C708 in FIGS. 4 and 6 to CLKD 107 at the input of the NEGATIVE VOLTAGE GENERATOR 104 (pdbiasgen3) in FIG. 10.

Figure 12:
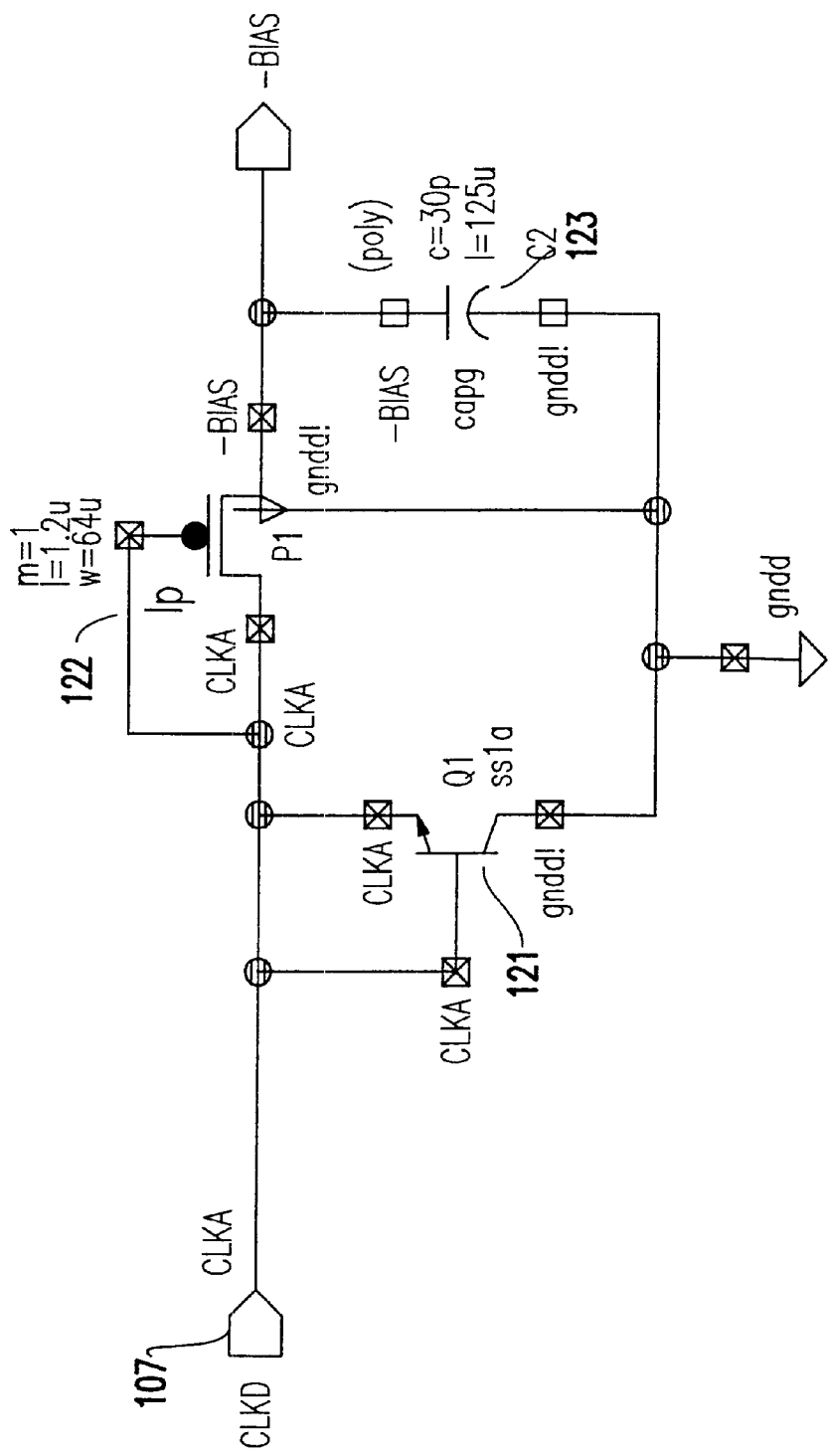
FIG. 12 is a circuit diagram for a negative voltage generator shown as a block in FIG. 10.
Figure 13A:
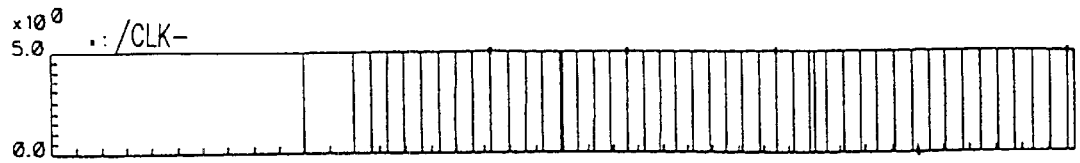
FIGS. 13A–13G show waveforms for test points and output of the isolator driver circuit where the contact test is affirmative.
Figure 13B:
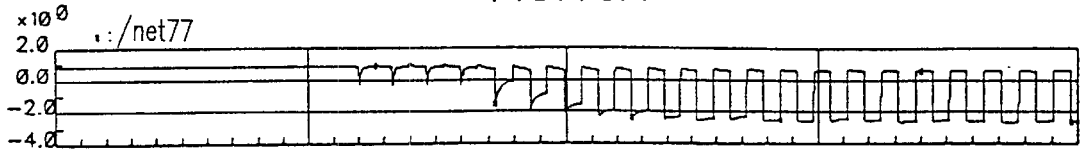

Turning now to FIG. 12, which shows detail on NEGATIVE VOLTAGE GENERATOR 104, diode-connected bipolar transistor Q1 121 clamps ac-coupled clock signal CLKD 107 so that it swings between 0.6 V and −2.5 V as shown in FIG. 13B, CLKD 107. This net negative voltage is negative-peak-detected by diode-connected PFET 122 (P1). Capacitor 123 (C2) filters out most of the clock signal to provide a negative voltage at I4B/ISOG 108 in FIG. 10 since PFET 102 (P501) is turned off. C2, P1 and Q1 are chosen and configured in the circuit to withstand negative voltage even though the most negative power supply rail is grounded.

Figure 13C:
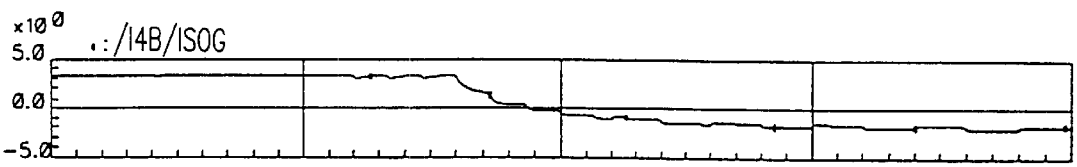
Figure 13D:
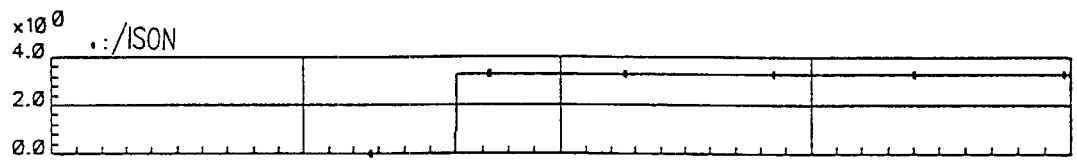
Figure 13E:
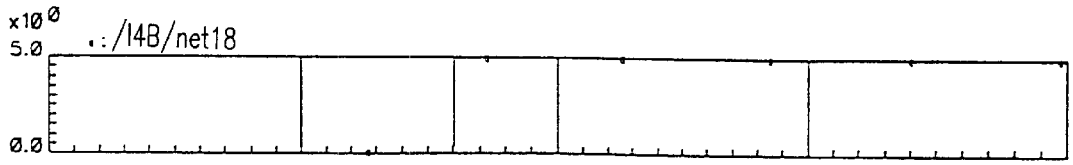
Figure 13F:
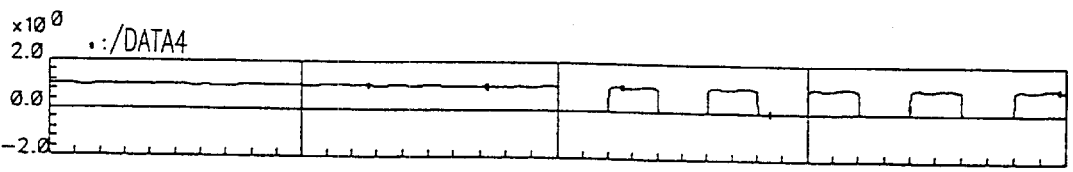
Figure 13G:
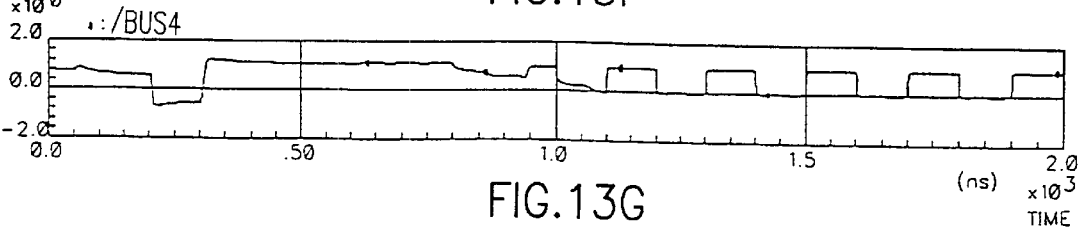

The negative voltage developed at I4B/ISOG 108 keeps PFET 101 (P502) turned on since VGS for PFET 101 (P502) is negative even when the source of P502 approaches ground. VDATA 41 is gated on at 600 ns, find swings from 0.0 V to 1.0 volts in this example. Other voltages up to the maximum DUT capability can be accommodated. The DATA 64 signal is coupled through 50-ohm resistors to four data paths in FIG. 6. The resistors simulate individual 50-ohm data drivers which more typically would be driven by separate data sources instead of DATA 64 in common. The simulated data path to DUT4 45 may be followed from DATA 64 through a 50-ohm resistor 61 in FIG. 6, and through the ISOLATING DATA DRIVER 19 (I4B in FIG. 6) to BUS 18 (BUS4 in FIGS. 6 and 7. ) Where contact has been made with both ESD diodes (the scenario whose BUS4 waveform is shown in FIG. 7) the I4B/ISOG 108 signal, shown in FIG. 13C, is modulated by data that is capacitively coupled from source to gate of PFET 101 (P502) in FIG. 10, but VGS of PFET 101 (P 502 ) is relatively constant so that PFET 101 (P 502) remains in its non-saturated mode to perform its transmission gate function. The modulation of I4B/ISOG 108 indicates that the negative drive for the gate of PFET 101 (P502) is supplied through a relatively high impedance which effectively reduces the shunt capacitance from BUS4 to ground via Cgs and Cgd of PFET 101 (P502).

FIG. 13 shows the waveforms associated with operation of ISOLATING DATA DRIVER 19 (I4B) shown as a block in FIG. 6 and in detail in FIGS. 10, 11 and 12. The data input (DATA 4 in FIG. 6 and ISOIN 105 in FIG. 10) is shown in FIG. 13F. The ISON input signal in FIG. 6 (and ISO− 106 in FIG. 10) is shown in FIG. 13D. The CLK− 65 input signal in FIG. 6 is shown in FIG. 13A before it is inverted by INVERTER 66 and coupled through capacitor 67 to CLKD 107 in FIGS. 6 and 10. FIG. 13E shows the waveform at net18 110, which is the output to the level translator 103 in FIG. 10.

The selection of logic signal timing and amplitude is not critical for most of the contact test and data transmission functions described above. The choice of 5.0 MHZ as a clock frequency can vary over a wide range. The waveforms resulting from simulation are clean and suggest that faster performance is possible. Other ESD diodes with different characteristics may be accommodated by changing VTHA–VTHC (26–28 in FIG. 1), and/or changing the amplitude of the contact test pulse TSCT− 31 in NEGATIVE PULSE GENERATOR 13 shown in FIG. 2. Values of VTHA–VTHC shown in FIG. 5 were selected to illustrate the example presented.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A contact test circuit for testing the electrical contact between a tester and a device under test (DUT), comprising:
   a voltage forcing network associated with said tester and electrically connectable to said DUT for forcing a predetermined voltage on said DUT for a predetermined time, said voltage forcing network comprising a DC voltage power supply circuit and a negative pulse generator circuit, each of which are electrically connectable to said DUT;
   a voltage evaluation network electrically connectable to said DUT for sensing a voltage returned by said DUT following said predetermined time and for comparing said returned voltage to a plurality of reference voltage, said voltage evaluation network comprising means for comparing a DC voltage returned from said DUT and to a DC threshold reference; and
   a contact status circuit for using said comparison to determine a status of said contact.

2. The circuit of claim 1, further comprising an isolator driver for isolating a data signal on said tester from said voltage forcing network and said voltage evaluation network during said contact testing.

3. The circuit of claim 1, wherein said comparing means is a plurality of DC comparators and wherein said contact status circuit converts results from said comparing means to a logical indication of the status of said electrical contact.

* * * * *